US012543537B2

(12) United States Patent
Yang et al.

(10) Patent No.: US 12,543,537 B2
(45) Date of Patent: Feb. 3, 2026

(54) TRANSFER DIE FOR MICRO-TRANSFER PRINTING WITH NON-CONDUCTIVE ISOLATION LAYER AND ISOLATION TRENCH

(71) Applicant: ROCKLEY PHOTONICS LIMITED, Cheshire (GB)

(72) Inventors: Hua Yang, Cork (IE); Adam Scofield, Los Angeles, CA (US); Frank Peters, Cork (IE)

(73) Assignee: Rockley Photonics Limited, Altrincham (GB)

( * ) Notice: Subject to any disclaimer, the term of this patent is extended or adjusted under 35 U.S.C. 154(b) by 688 days.

(21) Appl. No.: 17/904,583

(22) PCT Filed: Feb. 19, 2021

(86) PCT No.: PCT/EP2021/054143
§ 371 (c)(1),
(2) Date: Aug. 18, 2022

(87) PCT Pub. No.: WO2021/165467
PCT Pub. Date: Aug. 26, 2021

(65) Prior Publication Data
US 2023/0107343 A1    Apr. 6, 2023

(30) Foreign Application Priority Data

Feb. 21, 2020    (GB) ..................... 2002452

(51) Int. Cl.
*H01L 21/683*    (2006.01)
*H01L 21/02*    (2006.01)
(Continued)

(52) U.S. Cl.
CPC .... *H01L 21/6835* (2013.01); *H01L 21/02518* (2013.01); *H01L 21/76* (2013.01);
(Continued)

(58) Field of Classification Search
CPC ................. H01L 21/76; H01L 21/6835; H01L 21/02518; H10H 20/01; H10H 20/8215; H10H 20/855
See application file for complete search history.

(56) References Cited

U.S. PATENT DOCUMENTS 10,002,928 B1 *   6/2018   Raring ............... H10D 8/051
2009/0016399 A1   1/2009   Bowers
(Continued)

FOREIGN PATENT DOCUMENTS

EP    2 151 852 A1    2/2010
WO    WO 2020/030641 A1    2/2020

OTHER PUBLICATIONS

Pearton, Ion implantation for isolation of III-V semiconductors, Materials Science Reports, vol. 4, Issue 6, 1990, pp. 313-363, ISSN 0920-2307, https://doi.org/10.1016/S0920-2307(05)80001-5 (Year: 1990).*
(Continued)

*Primary Examiner* — Davienne N Monbleau
*Assistant Examiner* — Heim Kirin Grewal
(74) *Attorney, Agent, or Firm* — Womble Bond Dickinson (US) LLP

(57) ABSTRACT

A method of manufacturing a transfer die for use in a transfer print process. The manufactured transfer die comprises a semiconductor device suitable for bonding to a silicon-on-insulator wafer. The method comprises the steps of providing a non-conductive isolation region in a semiconductor stack, the semiconductor stack comprising a sacrificial layer above a substrate; and etching an isolation trench into the semiconductor stack from an upper surface thereof, such that the isolation trench extends only to a region of the semiconductor stack above the sacrificial layer. The isolation trench and the non-conductive isolation region
(Continued)

together separate a bond pad from a waveguide region in the optoelectronic device.

15 Claims, 8 Drawing Sheets

(51) Int. Cl.
   *H01L 21/76* (2006.01)
   *H10H 20/01* (2025.01)
   *H10H 20/81* (2025.01)
   *H10H 20/855* (2025.01)

(52) U.S. Cl.
   CPC ........ *H10H 20/01* (2025.01); *H10H 20/8215* (2025.01); *H10H 20/855* (2025.01); *H01L 2221/68327* (2013.01)

(56) References Cited

U.S. PATENT DOCUMENTS

| | | | |
|---|---|---|---|
| 2009/0065800 A1* | 3/2009 | Wirth | H10F 77/206 257/E33.059 |
| 2010/0187545 A1 | 7/2010 | Khan et al. | |
| 2011/0064106 A1 | 3/2011 | Xu et al. | |
| 2012/0002694 A1 | 1/2012 | Bowers et al. | |
| 2012/0300796 A1 | 11/2012 | Sysak et al. | |
| 2013/0301979 A1 | 11/2013 | Qian et al. | |
| 2014/0198816 A1* | 7/2014 | Margalit | H01S 5/22 372/45.01 |
| 2014/0339643 A1 | 11/2014 | Cheng et al. | |
| 2016/0094014 A1 | 3/2016 | Shin et al. | |
| 2016/0274319 A1 | 9/2016 | Krasulick et al. | |
| 2016/0306110 A1 | 10/2016 | Lambert | |
| 2017/0005113 A1 | 1/2017 | Cheng et al. | |
| 2020/0041721 A1* | 2/2020 | Yu | H01L 23/544 |

OTHER PUBLICATIONS

International Search Report of PCT/EP2021/054143, Aug. 13, 2021, 6 pages.
International Written Opinion of PCT/EP2021/054143, Aug. 13, 2021, 11 pages.
Ruggero, et al., "Transfer Printing of AlGaInAs/InP Etched Facet Lasers to Si Substrates", IEEE Photonics Journal, IEEE, vol. 8, No. 6, Dec. 1, 2016, 11 pp., XP011635419.
Invitation to Pay Additional Fees and Partial Search Report mailed May 25, 2021 in related International Application No. PCT/EP2021/054143, 16 pages.
U.K. Intellectual Property Office Examination Report, dated Dec. 13, 2022, for Patent Application No. GB2002452.7, 4 pages.
U.K. Intellectual Property Office Examination Report, dated Jun. 9, 2022, for Patent Application No. GB2002452.7, 6 pages.
U.K. Intellectual Property Office Search and Examination Report, dated Jul. 27, 2020, for Patent Application No. GB2002452.7, 6 pages.
U.K. Intellectual Property Office Search Report, dated Jun. 6, 2022, for Patent Application No. GB2002452.7, 3 pages.
U.K. Intellectual Property Office Examination Report, dated May 15, 2023, for Patent Application No. GB2002452.7, 3 pages.

* cited by examiner

TRANSFER DIE FOR MICRO-TRANSFER PRINTING WITH NON-CONDUCTIVE ISOLATION LAYER AND ISOLATION TRENCH

CROSS-REFERENCE TO RELATED APPLICATION(S)

This application is a U.S. national stage entry, under 35 U.S.C. § 371, of International Application Number PCT/EP2021/054143, filed on Feb. 19, 2021, which claims priority to British Patent Application Number 2002452.7, filed Feb. 21, 2020. The entire content of all of the applications identified in this paragraph is incorporated herein by reference.

FIELD OF THE INVENTION

The present invention relates to a transfer die used in a method of transfer printing, and a method of manufacturing a transfer die used in a method of transfer printing.

BACKGROUND

Micro-transfer printing (MTP) can be used to make hybrid III-V/Si integrated photonic components and circuits, for example as discussed in LOI et al, Transfer Printing of AlGaInAs/InP Etched Facet Lasers to Si Substrates, IEEE Photonics Journal, Vol. 8, No. 6, December 2016, the entire contents of which is incorporated herein by reference.

Generally, MTP involves the use of an elastomer stamp to transfer one or more microscale devices from a native substrate onto a non-native substrate. Specifically, an undercut is formed under each microscale device, such that the microscale device is anchored to the native substrate only at its end points (also referred to as tethers). The one or more microscale devices are then transferred from the native substrate, by an elastomer stamp, to a target non-native substrate. The one or more microscale devices are attached to the elastomer stamp during the transfer from the native substrate to the non-native substrate by Van der Waals forces.

However, conventional MTP techniques are unable to create high-speed devices. This is because conventional photonic devices designed for MTP have a large parasitic capacitance. Specifically, these devices have a large parasitic capacitance in a bond pad of the device, used to connect the device to electrical components (e.g. drivers, detectors, etc.).

Parasitic capacitance in high speed devices which are not suitable for MTP can be reduced in a number of ways, specifically by fully isolating the bond pad. For example, isolation of the bond pad can be accomplished by etching a trench around the bond pad into a semi-insulating or insulating part of a wafer. However, these solutions for reducing parasitic capacitance in high speed devices which are not suitable for MTP cannot be easily transferred to high speed devices which are suitable for MTP.

Therefore, it would be advantageous to reduce the parasitic capacitance of a bond pad of a photonic device suitable for MTP, to thus enable high speed operation.

SUMMARY

At a general level, embodiments of the invention provide a transfer die suitable for MTP, wherein the transfer die comprises an optoelectronic device, the optoelectronic device having a low-capacitance bond pad. Embodiments of the invention also provide a method of manufacturing a transfer die suitable for MTP, wherein the manufactured transfer die comprises an optoelectronic device, the optoelectronic device having a low capacitance bond pad. Further embodiments of the invention provide a hybrid III-V/Si optoelectronic device and a method of manufacturing a hybrid III-V/Si optoelectronic device via a transfer print process.

In a first aspect, embodiments of the invention provide a method of manufacturing a transfer die, the transfer die comprising an optoelectronic device suitable for bonding to a silicon-based platform via a transfer print process, the method comprising the steps of:

providing a non-conductive isolation region in a semiconductor stack, the semiconductor stack comprising a sacrificial layer above a substrate; and etching an isolation trench into the semiconductor stack from an upper surface thereof, such that the isolation trench extends only to a region of the semiconductor stack above the sacrificial layer, wherein the isolation trench and the non-conductive isolation region together separate the bond pad from the waveguide region in the optoelectronic device.

Accordingly, as the bond pad is separated from the waveguide region by the isolation trench and the non-conductive isolation region together, the bond pad is isolated from the waveguide region by the combination of the isolation trench and the non-conductive isolation region. Thus, parasitic capacitance in the bond pad is reduced, thereby resulting in a low-capacitance bond pad. Therefore, high speed operation can be enabled.

The method according to the first aspect may have any one or, to the extent they are compatible, any combination of the following optional features.

As used herein, the terms "vertically" and "horizontally" are to be understood as relative to the substrate such that "vertically" is perpendicular to an upper surface of the substrate, and "horizontally" relates to a direction which lies within any plane that is parallel to the plane which lies along the upper surface of the substrate. It is to be understood that the terms "upper" and "lower" are to be considered as relative to the substrate, such that a "lower" layer of the semiconductor stack is closer to the substrate than a "higher" layer.

As used herein, the term "isolated" is to be understood as electrically isolated.

The non-conductive isolation region and the isolation trench may be located between the bond pad and the waveguide region in the optoelectronic device to space the bond pad from the waveguide region.

The non-conductive region and the isolation trench may together laterally separate (or laterally space) the bond pad from the waveguide region to thereby isolate the bond pad from the waveguide region. It is to be understood that by laterally separating the bond pad and the waveguide region, the bond pad and waveguide region are spaced from each other in the horizontal direction.

The waveguide region may be for guiding light through the optoelectronic device and the bond pad may be for providing an electrical connection to the optoelectronic device.

The substrate may be a native substrate, and more particularly a native substrate from which the optoelectronic device may be transferred to a non-native silicon-based platform later in the transfer print process.

The semiconductor stack may be a III-V semiconductor stack. The optoelectronic device may therefore be a III-V optoelectronic device.

As the isolation trench is etched such that it extends only to a region of the semiconductor stack above the sacrificial layer, the isolation trench terminates at a region of the semiconductor stack above the sacrificial layer and does not extend to the sacrificial layer itself. Specifically, the isolation trench only partially extends into the semiconductor stack, such that an intermediate layer of the semiconductor device may remain between a bottom (i.e. lower end) of the isolation trench and the sacrificial layer.

Optionally, the non-conductive isolation region may be an iron-doped non-conductive isolation region.

In some embodiments, the semiconductor stack may comprise an iron-doped layer. Accordingly, the non-conductive isolation region may be an iron-doped layer in the semiconductor stack. The iron-doped layer may be above the sacrificial layer. In these embodiments, the isolation trench may be etched from the upper surface of the semiconductor stack to/into the iron-doped layer to separate (and thus isolate) the waveguide region from the bond pad.

In other embodiments, the non-conductive isolation region may be created in the semiconductor stack by implantation. In these embodiments, the method may comprise the step of implanting ions in the semiconductor stack beneath (i.e. below) the isolation trench. In some examples, the ions are selected from the list of: hydrogen, helium, oxygen, and iron.

The implanted non-conductive isolation region may extend from a bottom (i.e. lower end) of the etched isolation trench to the sacrificial layer. Accordingly, the etched isolation trench may extend from the upper surface of the semiconductor stack to the implanted non-conductive isolation region to separate (and thus isolate) the waveguide region from the bond pad.

The semiconductor stack may further comprise a first doped layer, a second doped layer and an optically active layer (e.g. multiple quantum well layer). The first doped layer may contain dopants of a different species to the second doped layer. Specifically, the first doped layer may have an opposite doping type to the second doped layer. For example the first doped layer may be p-doped, and the second doped layer may be n-doped (or vice versa).

The first doped layer may be on top of the optically active layer, and the optically active layer may be on top of the second doped layer.

The semiconductor stack may further comprise a heavily doped layer on top of the first doped layer, the heavily doped layer containing dopants of the same species as the first doped layer. The heavily doped layer may have a higher concentration of dopants than the first doped layer.

In embodiments in which the semiconductor stack comprises an iron-doped layer, the second doped layer may be on top of the iron-doped layer.

In some embodiments, the method may further comprise the step of providing a Benzocyclobutene (BCB) fill, or other polymer fill (which may be spun-coated) in the isolation trench. The BCB fill may retain the isolation (and therefore low capacitance) of the bond pad.

In other embodiments, the method may further comprise the step of epitaxially growing an iron-doped material in the isolation trench from the non-conductive isolation region. The iron-doped material grown in the isolation trench may mechanically strengthen the optoelectronic device, whilst retaining the isolation (and therefore low capacitance) of the bond pad.

In some embodiments, the method may further comprise the step of epitaxially growing an iron-doped material from the non-conductive isolation region to form the bond pad. The bond pad may therefore be formed from iron-doped material. This may mechanically strengthen the optoelectronic device. In these embodiments, the method may comprise the step of forming the waveguide region before epitaxially growing the iron-doped material from the non-conductive isolation region to form the bond pad.

The method may further comprise the steps of:
  providing a first electrical contact in electrical connection with the heavily doped region and the bond pad; and
  providing a second electrical contact in electrical connection with the second doped region.

The method may further comprise the step of etching away the sacrificial layer. Specifically, the sacrificial layer may be etched away leaving an undercut region which spaces the optoelectronic device from the substrate. After this step, the optoelectronic device may be mechanically connected to the substrate by one or more tethers. The resultant transfer die is then ready for micro-transfer printing, and bonding to a silicon-based platform.

In a second aspect, embodiments of the invention provide a method of manufacturing a transfer die, the manufactured transfer die comprising an optoelectronic device suitable for bonding to a silicon-based platform via a transfer print process, the method comprising the steps of:
  creating a first doped region in a portion of an un-doped region of a semiconductor stack, the semiconductor stack comprising an optically active layer above a second doped region, wherein the first doped region contains dopants of a different species to the second doped region; and
  etching an isolation trench into the semiconductor stack from an upper surface thereof, to the second doped region, wherein the isolation trench separates a waveguide region comprising the first doped region from a remaining portion of the un-doped region, the remaining portion of the un-doped region forming an un-doped bond pad of the optoelectronic device.

By localising the doping of the first doped region to the waveguide region, the un-doped bond pad is separated, and thus isolated, from the waveguide region by the isolation trench. Furthermore, as the bond pad is un-doped, parasitic capacitance in the bond pad is reduced, thereby resulting in a low-capacitance bond pad. Therefore, high speed operation can be enabled.

The method of the second aspect may have any one or, to the extent they are compatible, any combination of the following optional features.

The semiconductor stack may be located above a substrate. As used herein, the terms "vertically" and "horizontally" are to be understood as relative to the substrate such that "vertically" is perpendicular to the upper surface of the substrate, and "horizontally" relates to a direction which lies within any plane that is parallel to the plane which lies along the upper surface of the substrate.

It is to be understood that the terms "upper" and "lower" are to be considered as relative to the substrate, such that a "lower" layer of the semiconductor stack is closer to the substrate than a "higher" layer of the semiconductor stack.

As used herein, the term "isolated" is to be understood as electrically isolated.

The isolation trench may be located between the un-doped bond pad and the waveguide region in the optoelectronic device to space the un-doped bond pad from the waveguide region.

The isolation trench may laterally separate (or laterally space) the un-doped bond pad and the waveguide region to thereby isolate the un-doped bond pad from the waveguide region. It is to be understood that by laterally separating the un-doped bond pad and the waveguide region, the un-doped bond pad and the waveguide region are spaced from each other in the horizontal direction.

The waveguide region may be for guiding light through the optoelectronic device and the bond pad may be for providing an electrical connection to the optoelectronic device.

The substrate may be a native substrate, and more particularly a native substrate from which the optoelectronic device may be transferred to a non-native silicon-based platform later in the transfer print process.

The semiconductor stack may be a III-V semiconductor stack. The optoelectronic device may therefore be a III-V optoelectronic device.

The first doped region may have an opposite doping type to the second doped region. For example the first doped region may be p-doped, and the second doped region may be n-doped (or vice versa).

The first doped region may be created in the semiconductor stack by localised diffusion of a dopant.

In some embodiments, the method may further comprise the step of providing a Benzocyclobutene (BCB) fill, or other polymer fill (which may be spun-coated) in the isolation trench. The BCB fill may retain the isolation (and therefore low capacitance) of the bond pad, whilst mechanically strengthening the optoelectronic device.

In some embodiments, the method may further comprise the step of creating a heavily doped region in a portion of the first doped region, the heavily doped region containing dopants of the same species as the first doped region. The heavily doped region may have a higher concentration of dopants than the first doped region.

The method may further comprise the steps of:
providing a first electrical contact in electrical connection with the heavily doped region and the bond pad; and
providing a second electrical contact in electrical connection with the second doped region.

In some embodiments, the semiconductor stack may comprise a sacrificial layer above the substrate.

The method may further comprise the step of etching away the sacrificial layer. Specifically, the sacrificial layer may be etched away leaving an undercut region which spaces the optoelectronic device from the substrate. After this step, the optoelectronic device may be mechanically connected to the substrate by one or more tethers. The resultant transfer die is then ready for micro-transfer printing, and bonding to a silicon-based platform.

In a third aspect, embodiments of the invention provide a transfer die manufactured by the method of the first aspect or the second aspect, including any one, or any combination insofar as they are compatible, of the optional features discussed with relation thereto.

In a fourth aspect, embodiments of the invention provide a transfer die comprising an optoelectronic device and a substrate, the optoelectronic device being suitable for bonding to a silicon-based platform via a transfer print process, wherein the optoelectronic device comprises a waveguide region for guiding light through the optoelectronic device, a bond pad for providing an electrical connection to the optoelectronic device, an isolation trench and a non-conductive iron-doped isolation region, and wherein the bond pad is separated from the waveguide region by the isolation trench and the iron-doped isolation region.

Optionally, the iron-doped isolation region is an iron-doped layer of the optoelectronic device.

The isolation trench may extend vertically from an upper surface of the optoelectronic device to/into the iron-doped layer of the optoelectronic device, such that the isolation trench and the iron-doped layer together laterally separate and thus isolate the waveguide region from the bond pad. It is to be understood that by laterally separating the bond pad and the waveguide region, the bond pad and waveguide region are spaced from each other in the horizontal direction.

In a fifth aspect, embodiments of the invention provide a transfer die comprising an optoelectronic device and a substrate, the optoelectronic device being suitable for bonding to a silicon-based platform via a transfer print process, wherein the optoelectronic device comprises a waveguide region for guiding light through the optoelectronic device, a bond pad for providing an electrical connection to the optoelectronic device, an isolation trench and a non-conductive ion-implantation isolation region, and wherein the bond pad is separated from the waveguide region by the isolation trench and the ion-implantation region.

Optionally, the isolation trench may extend vertically from an upper surface of the optoelectronic device to/into the ion-implantation region, such that the isolation trench and the ion implantation region together laterally separate and thus isolate the waveguide region from the bond pad. It is to be understood that by laterally separating the bond pad and the waveguide region, the bond pad and waveguide region are spaced from each other in the horizontal direction. The isolation trench may be formed by providing a protective coating, e.g. a thick layer of photoresist before implantation.

The transfer die of the fourth or fifth aspect may have any one, or to the extent they are compatible, any combination of the following optional features.

The non-conductive isolation region and the isolation trench may be located between the bond pad and the waveguide region in the optoelectronic device to space the bond pad from the waveguide region.

The optoelectronic device may comprise an optically active layer, a first doped region and a second doped region. The optically active layer may separate the first and the second doped regions. Specifically, the first doped region may be on top of the optically active layer which may be on top of the second doped region. The first doped region may contain dopants of a different species to the second doped region. Specifically, the first doped region may have an opposite doping type to the second doped region. For example, the first doped region may be p-doped, and the second doped region may be n-doped (or vice versa).

In some embodiments, the isolation trench may contain an iron-doped material fill. The iron-doped material fill may laterally separate and mechanically connect the waveguide region and the bond pad. The iron-doped material is non-conductive and thus the iron-doped material fill retains the isolation of the bond pad from the waveguide region. In this way, the iron-doped material fill retains a low capacitance bond pad but mechanically strengthens the optoelectronic device.

In some embodiments, the bond pad may comprise an iron-doped material.

In a sixth aspect, embodiments of the invention provide a transfer die comprising an optoelectronic device and a substrate, the optoelectronic device being suitable for bonding to a silicon-based platform via a transfer print process, wherein the optoelectronic device comprises:

a waveguide region comprising a first doped region, a second doped region and an optically active region, the first doped region containing dopants of a different species to the second doped region; and an un-doped bond pad, wherein the un-doped bond pad is separated from the waveguide region by an isolation trench.

Accordingly, as the bond pad is un-doped and separated from the waveguide region, parasitic capacitance in the bond pad is reduced, resulting in a low-capacitance bond pad. Therefore, high-speed operation is enabled.

It is to be understood that an un-doped bond pad may be a non-conductive bond pad which contains no dopants.

The isolation trench may be located between the un-doped bond pad and the waveguide region in the optoelectronic device to space the bond pad from the waveguide region.

The isolation trench may together laterally separate (or laterally space) the un-doped bond pad and the waveguide region to thereby isolate the un-doped bond pad from the waveguide region. It is to be understood that by laterally separating the un-doped bond pad and the waveguide region, the un-doped bond pad and waveguide region are spaced from each other in the horizontal direction.

The waveguide region may be for guiding light through the optoelectronic device, and the bond pad may be for providing an electrical connection to the optoelectronic device.

In some embodiments, the first doped region may be localised/confined to the waveguide region.

The transfer die may comprise a substrate beneath the optoelectronic device.

The transfer die of the fourth, fifth, or sixth aspect may have any one, or to the extent they are compatible, any combination of the following optional features.

As used herein, the terms "vertically" and "horizontally" are to be understood as relative to the substrate such that "vertically" is perpendicular to the upper surface of the substrate, and "horizontally" relates to a direction which lies within any plane that is parallel to the plane which lies along the upper surface of the substrate.

It is to be understood that the terms "upper" and "lower" are to be considered as relative to the substrate, such that the substrate forms the "lowermost" layer of the transfer die.

As used herein, the term "isolated" is to be understood as optically isolated.

The substrate may be a native substrate, and more particularly a native substrate from which the optoelectronic device may be transferred to a non-native silicon-based platform later in the transfer print process.

The optoelectronic device may be a III-V optoelectronic device, in that it includes components formed of III-V based semiconductors.

The optoelectronic device may be spaced from the substrate. Specifically, an undercut region may space the substrate from the optoelectronic device. The optoelectronic device may be mechanically connected to the substrate by one or more tethers.

In some embodiments, the isolation trench may contain a Benzocyclobutene (BCB) fill. Accordingly, the BCB fill laterally separates and mechanically connects the waveguide region and the bond pad. In this way, the BCB fill mechanically strengthens the optoelectronic device, whilst retaining the isolation (and low capacitance) of the bond pad.

Optionally, the optoelectronic device may comprise a heavily doped region on top of the first doped region, the heavily doped region containing dopants of the same species as the first doped region. The first doped region may have a higher concentration of dopants than the first doped region.

The optoelectronic device may further comprise a first electrical contact, and a second electrical contact.

The first electrical contact may be electrically connected to the heavily doped region and the bond pad. The second electrical contact may be electrically connected to the second doped region.

In a seventh aspect, embodiments of the invention provide a method of manufacturing a hybrid III-V optoelectronic device by a transfer print process, the method comprising transferring, using an elastomer stamp, the optoelectronic device of the transfer die of any of the third, fourth, fifth or sixth aspect from the substrate to a silicon-based platform, wherein the optoelectronic device is a III-V optoelectronic device.

In an eighth aspect, embodiments of the invention provide a method of manufacturing a hybrid III-V/Si optoelectronic device by a transfer print process, the hybrid III-V/Si optoelectronic device comprising a III-V optoelectronic device bonded to a silicon-based platform, wherein the III-V optoelectronic device comprises a waveguide region and a bond pad, the method comprising a step of:

etching a trench in the silicon-based platform; and bonding the III-V optoelectronic device to the silicon-based platform, such that the trench is underneath the bond pad.

In this way, the spacing between the bond pad and the silicon-based platform may be increased such that a parasitic capacitive coupling between the bond pad of the III-V semiconductor device and the silicon-based platform may be reduced.

The method of the eighth aspect may further comprise the step of transferring, using a stamp (which may be formed of elastomer), the III-V optoelectronic device from a substrate to the silicon-based platform.

As used herein, the terms "vertically" and "horizontally" are to be understood as relative to the lower surface of the silicon-based platform, such that "vertically" is perpendicular to the lower surface of the silicon-based platform, and "horizontally" relates to a direction which lies within any plane that is parallel to the plane which lies along the lower surface of the silicon-based platform.

It is to be understood that the terms "upper" and "lower" are to be considered as relative to the silicon-based platform, such that the silicon-based platform forms the "lowermost" layer of the hybrid III-V/Si optoelectronic device.

By etching a trench in the silicon-based platform underneath the bond pad, a spacing between the III-V optoelectronic device and the silicon-based platform may be greater at a region of the hybrid III-V/Si optoelectronic device underneath the bond pad than a region of the hybrid III-V/Si optoelectronic device not underneath the bond pad.

Specifically, the spacing between the III-V optoelectronic device and the silicon-based platform beneath the bond pad may be greater than the spacing between the III-V optoelectronic device and the Si-based platform beneath the waveguide region.

A portion of the silicon-based platform underneath the bond pad may be partially or completely etched away. In this way, a parasitic capacitive coupling between the bond pad the silicon-based platform may be reduced (or eliminated), thus reducing the parasitic capacitance in the bond pad.

The trench in the silicon-based platform may be etched to a depth in the range of approximately 1-100 μm, for example. Particularly, the trench in the silicon-based platform may have a depth of approximately 10 μm.

The III-V optoelectronic device may comprise an isolation trench, the isolation trench separating (e.g. laterally spacing) the waveguide region from the bond pad.

The III-V optoelectronic device may further comprise a non-conductive isolation region. The isolation trench and the non-conductive isolation region may together separate, and thus isolate, the bond pad from the waveguide region in the III-V optoelectronic device.

As used herein, the term "isolated" is to be understood as electrically isolated.

The non-conductive isolation region may be an iron-doped non-conductive isolation region or layer. The isolation trench may extend vertically from an upper surface of the III-V optoelectronic device to/into the iron-doped layer of the optoelectronic device, such that the isolation trench and the iron-doped layer together separate, and thus isolate, the waveguide region from the bond pad.

Alternatively, the non-conductive isolation region may be a non-conductive ion-implantation isolation region. The isolation trench may extend vertically from an upper surface of the III-V optoelectronic device to/into the ion-implantation region, such that the isolation trench and the ion implantation region together separate, and thus isolate, the waveguide region from the bond pad.

The III-V optoelectronic device may comprise an optically active layer, a first doped region and a second doped region. The optically active layer may separate the first and the second doped regions. Specifically, the first doped region may be on top of the optically active layer which may be on top of the second doped region. The first doped region may contain dopants of a different species to the second doped region. Specifically, the first doped region may have an opposite doping type to the second doped region. For example, the first doped region may be p-doped, and the second doped region may be n-doped (or vice versa).

In some embodiments, the isolation trench may contain an iron-doped material fill. The iron-doped material fill may laterally separate and mechanically connect the waveguide region and the bond pad. The iron-doped material is non-conductive and thus the iron-doped material fill retains the isolation of the bond pad from the waveguide region. In this way, the iron-doped material fill retains a low capacitance bond pad but mechanically strengthens the optoelectronic device.

In some embodiments, the bond pad may comprise an iron-doped material.

In other embodiments, the bond pad may be un-doped, and the un-doped bond may be separated, and thus isolated, from the waveguide region by the isolation trench. In these embodiments, the first doped region may be localised/confined to the waveguide region.

In some embodiments, the isolation trench may contain a Benzocyclobutene (BCB) fill, or other polymer fill. Accordingly, the BCB fill laterally separates and mechanically connects the waveguide region and the bond pad.

Optionally, the III-V optoelectronic device may comprise a heavily doped region on top of the first doped region, the heavily doped region containing dopants of the same species as the first doped region. The first doped region may have a higher concentration of dopants than the first doped region.

The hybrid III-V/Si optoelectronic device may further comprise a first electrical contact, and a second electrical contact.

The first electrical contact may be electrically connected to the heavily doped region and the bond pad of the III-V optoelectronic device. The second electrical contact may be electrically connected to the second doped region of the III-V optoelectronic device.

In a ninth aspect, embodiments of the invention provide a hybrid III-V/Si optoelectronic device comprising a III-V optoelectronic device bonded to a silicon-based platform, the III-V optoelectronic device comprising a waveguide region for guiding light through the optoelectronic device, and a bond pad for providing an electrical connection to the optoelectronic device, wherein the silicon-based platform comprises a trench beneath the bond pad.

In this way, a spacing between the III-V optoelectronic device and the silicon-based platform is greater at a region of the hybrid III-V/Si optoelectronic device beneath the bond pad than a region of the hybrid III-V/Si optoelectronic device not beneath the bond pad. Accordingly, parasitic capacitive coupling between the bond pad and the silicon-based platform may be reduced, thus reducing the parasitic capacitance of the bond pad.

The spacing between the III-V optoelectronic device and the silicon-based platform beneath the bond pad may be greater than the spacing between the III-V optoelectronic device and the based platform beneath the waveguide region.

A portion of the silicon-based platform underneath the bond pad may be partially or completely etched away to form the trench. In this way, a parasitic capacitive coupling between the bond pad the silicon-based platform may be reduced (or eliminated), thus reducing the parasitic capacitance in the bond pad.

The trench in the silicon-based platform may have a depth in the range of approximately 1-100 µm, for example. Particularly, the trench in the silicon-based platform may have a depth of approximately 10 µm.

The III-V optoelectronic device may comprise an isolation trench, the isolation trench separating (e.g. laterally spacing) the waveguide region from the bond pad.

The III-V optoelectronic device may further comprise a non-conductive isolation region. The isolation trench and the non-conductive isolation region may together separate, and thus isolate, the bond pad from the waveguide region in the III-V optoelectronic device.

As used herein, the term "isolated" is to be understood as electrically isolated.

The non-conductive isolation region may be an iron-doped non-conductive isolation region or layer. The isolation trench may extend vertically from an upper surface of the III-V optoelectronic device to/into the iron-doped layer of the optoelectronic device, such that the isolation trench and the iron-doped layer together separate and thus isolate the waveguide region from the bond pad.

Alternatively, the non-conductive isolation region may be a non-conductive ion-implantation isolation region. The isolation trench may extend vertically from an upper surface of the III-V optoelectronic device to/into the ion-implantation region, such that the isolation trench and the ion implantation region together separate, and thus isolate, the waveguide region from the bond pad.

The III-V optoelectronic device may comprise an optically active layer, a first doped region and a second doped region. The optically active layer may separate the first and the second doped regions. Specifically, the first doped region may be on top of the optically active layer which may be on top of the second doped region. The first doped region may contain dopants of a different species to the second doped region. Specifically, the first doped region may have an opposite doping type to the second doped region. For example, the first doped region may be p-doped, and the second doped region may be n-doped (or vice versa).

In some embodiments, the isolation trench may contain an iron-doped material fill. The iron-doped material fill may laterally separate and mechanically connect the waveguide region and the bond pad. The iron-doped material is non-conductive and thus the iron-doped material fill retains the isolation of the bond pad from the waveguide region. In this way, the iron-doped material fill retains a low capacitance bond pad but mechanically strengthens the optoelectronic device.

In some embodiments, the bond pad may comprise an iron-doped material.

In other embodiments, the bond pad may be un-doped, and the un-doped bond may be separated, and thus isolated, from the waveguide region by the isolation trench. In these embodiments, the first doped region may be localised/confined to the waveguide region.

In some embodiments, the isolation trench may contain a Benzocyclobutene (BCB) fill, or other polymer fill. Accordingly, the BCB fill laterally separates and mechanically connects the waveguide region and the bond pad.

Optionally, the III-V optoelectronic device may comprise a heavily doped region on top of the first doped region, the heavily doped region containing dopants of the same species as the first doped region. The first doped region may have a higher concentration of dopants than the first doped region.

The hybrid III-V/Si optoelectronic device may further comprise a first electrical contact, and a second electrical contact.

The first electrical contact may be electrically connected to the heavily doped region and the bond pad of the III-V optoelectronic device. The second electrical contact may be electrically connected to the second doped region of the III-V optoelectronic device.

The optoelectronic device of any of the above aspects may be an electro-absorption modulator (EAM), for example.

It is to be understood that the structure of the transfer die/hybrid III-V/Si optoelectronic device of the above aspects may be detected by a secondary ion mass spectrometry (SIMS) analysis. An iron-doped material growth could be detected in a secondary electron microscope (SEM analysis) and a SIMS analysis.

BRIEF DESCRIPTION OF THE DRAWINGS

Embodiments of the invention will now be described by way of example with reference to the accompanying drawings in which.

DETAILED DESCRIPTION AND FURTHER OPTIONAL FEATURES

Aspects and embodiments of the present invention will now be discussed with reference to the accompanying figures. Further aspects and embodiments will be apparent to those skilled in the art. The detailed description set forth below in connection with the appended figures is intended as a description of exemplary embodiments of the invention and is not intended to represent the only forms in which the present invention may be constructed or utilized.

Figure 1:
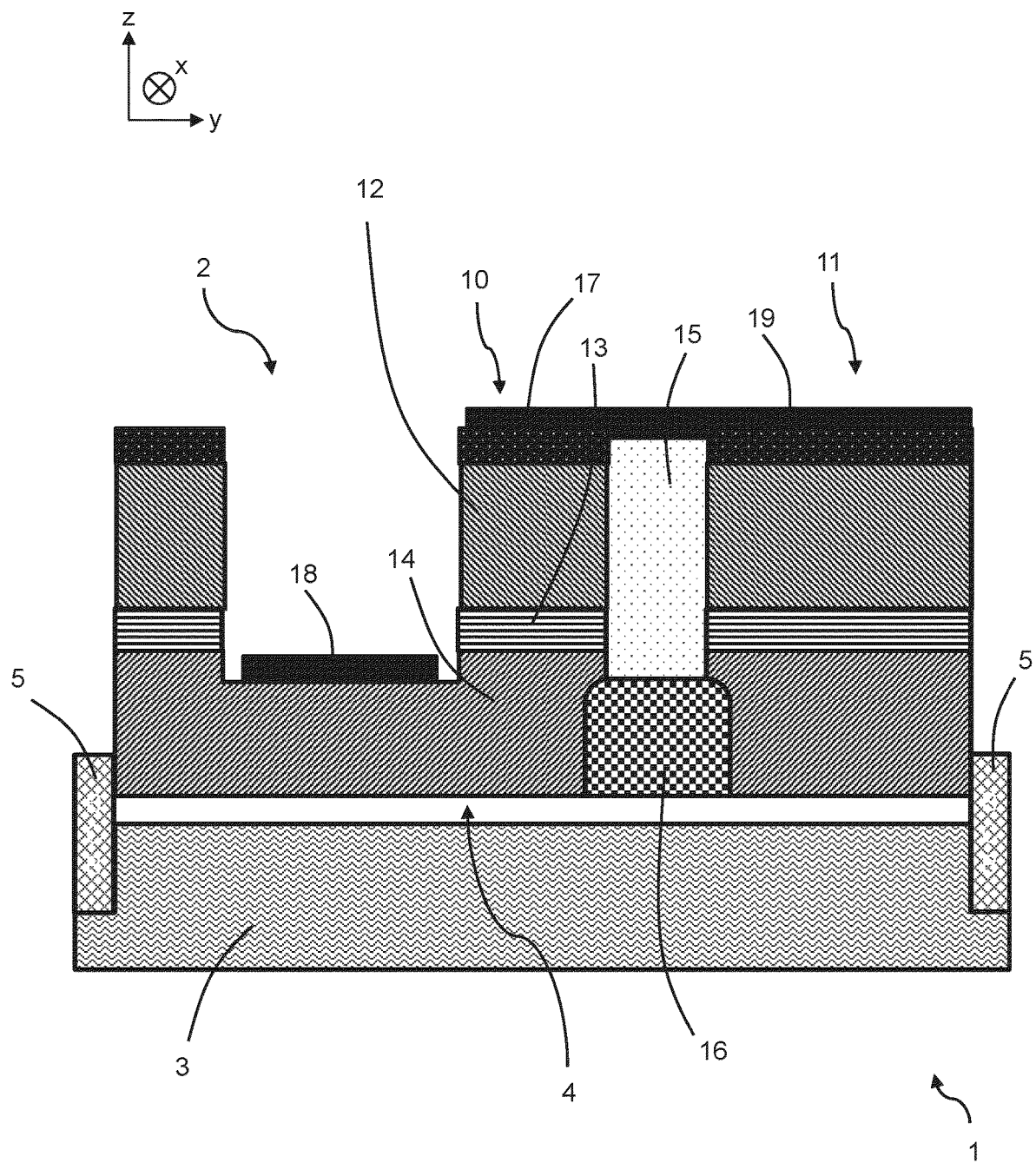
FIG. 1 is a schematic cross-section of a transfer die according to an embodiment of the invention.

FIG. 1 illustrates a schematic cross-section of a transfer die, also referred to as a device coupon, 1 according to an embodiment of the invention. The cross-section looks along the line (x) along which light is guided by a waveguide 10 of the device. The transfer die 1 comprises a III-V optoelectronic device 2 and a native III-V substrate 3. The transfer die 1 is suitable for use in an MTP process, in which the optoelectronic device 2 is transferred, using an elastomer stamp, from the native substrate 3 to a non-native platform e.g. a silicon-based platform. The optoelectronic device 2 can then be bonded to the non-native silicon-based platform to form a hybrid III-V/Si optoelectronic device.

The optoelectronic device 2 is spaced from the substrate 3 by an undercut region 4, but is mechanically connected to the substrate 3 by tethers 5. In the MTP process, an elastomer stamp lifts the optoelectronic device 2 from the substrate 3, thereby severing the tethers 5, such that the optoelectronic device 2 can then be transferred to the non-native platform.

The optoelectronic device 2 comprises a waveguide region 10, and a bond pad 11. The waveguide region 10 is a region of the optoelectronic device 2 in which an optical mode propagates, and is formed by a p-doped region 12, an optically active layer 13, and an n-doped region 14. The optically active layer 13 (e.g. multiple quantum well layer) separates the p-doped region 12 from the n-doped region 14, with the optically active layer 13 on top of the n-doped region 14, and the p-doped region 12 on top of the optically active layer 13.

An isolation trench 15 extends vertically into the optoelectronic device 2 from a top surface of the optoelectronic device 2 towards the substrate 3. The isolation trench 15 laterally separates the waveguide region 10 and the bond pad 11, and contains a BCB fill.

A non-conductive ion-implantation isolation region 16 is formed beneath the isolation trench 15. The ion-implantation isolation region 16 extends from a lower end (i.e. bottom) of the isolation trench 15 to the lower surface of the optoelectronic device 2. Accordingly, the isolation trench 15 and the ion-implantation isolation region 16 together separate and thus isolate the waveguide region 10 from the bond pad 11.

The non-conductive ion-implantation isolation region may comprise hydrogen ions, helium ions, oxygen ions, or iron ions.

The waveguide region 10 also comprises a p+ doped 17 region on top of the p-doped region 12. A metal n-contact 18 is electrically connected to the n-doped region 14 and a p-contact 19 is electrically connected to the p+ doped region 17 and the bond pad 11.

Although not shown in the figures, in a method of manufacturing the transfer die 1 of FIG. 1, a III-V semiconductor stack is provided. The semiconductor stack is located above a native substrate 3, and comprises a sacrificial layer on top of the native substrate 3, an n-doped layer on top of the sacrificial layer, an optically active layer on top of the n-doped layer, a p-doped layer on top of the optically active layer, and a p+ doped layer on top of the p-doped layer.

The native substrate 3 may be an indium phosphide (InP) substrate, the sacrificial layer may be an indium gallium arsenide (InGaAs) sacrificial layer or aluminium indium arsenide (AlInAs) sacrificial layer, the n-doped layer may be an n-doped indium phosphide (N—InP) layer, the optically active layer may be an aluminium indium gallium arsenide (AlInGaAs) multiple quantum well layer, the p-doped layer may be a p-doped indium phosphide (P—InP) layer, and the p+ doped layer may be a p-doped indium gallium arsenide (P—InGaAs) layer, for example.

An isolation trench 15 is etched in the semiconductor stack from the upper surface thereof, such that the isolation trench 15 extends vertically downwards into the semiconductor stack. Standard patterning and etching techniques are used.

The isolation trench 15 extends through the p+ doped layer, the p-doped layer, the optically active layer and into the n-doped layer. The isolation trench 15 terminates in the n-doped layer and therefore does not extend to/into the sacrificial layer. As such, the bottom of the isolation trench 15 is in the n-doped layer.

Next, ions (e.g. hydrogen, helium, oxygen or iron ions) are implanted in a portion of the n-doped layer from the bottom of the isolation trench 15 to form the ion-implantation region 16. This ion implantation makes the portion of the n-doped layer non-conductive such that the ion-implantation region 16 is non-conductive. The ion-implantation region 16 extends from the bottom of the isolation trench 15 to, or through, the sacrificial layer. Accordingly, the vertically-extending isolation trench 15 and the non-conductive ion-implantation region 16 together laterally space and isolate the waveguide region 10 from the bond pad 11.

Next, a BCB fill is provided in the isolation trench 15, which retains the separation and thus isolation of the bond pad 11 from waveguide region 10, but mechanically strengthens the optoelectronic device.

The sacrificial layer is etched away from underneath the n-doped layer to vertically space the optoelectronic device 2 from the native substrate 3. Standard etching techniques are used to etch away the sacrificial layer, leaving an undercut region 4, and tethers 5 mechanically connecting the optoelectronic device 2 and the substrate 3.

Also, a portion of the semiconductor stack is etched (using standard patterning and etching techniques) to the n-doped layer, and an n-contact 18 is electrically connected to the n-doped layer. A p-contact 19 is electrically connected to the p+ doped layer in the waveguide region 10 and the bond pad 11.

Figure 2A:
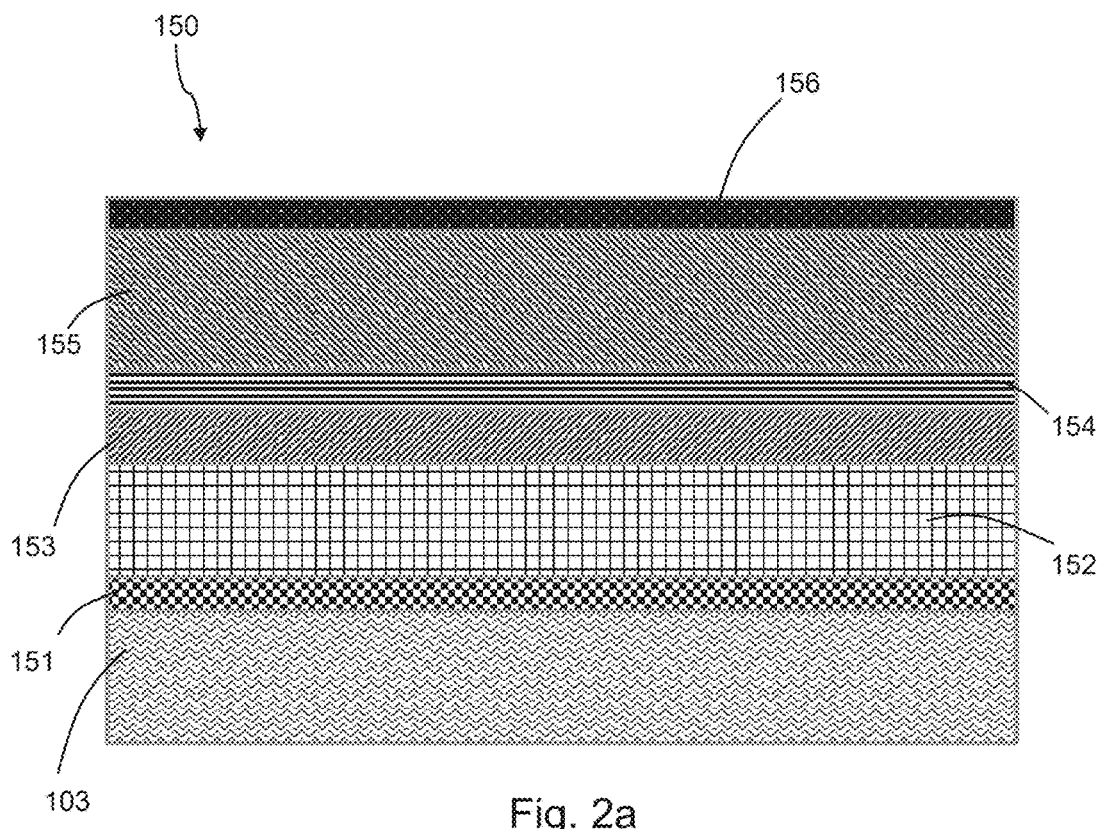
FIGS. 2a and 2b illustrate a method of manufacturing a transfer die according to an embodiment of the invention.
Figure 2B:
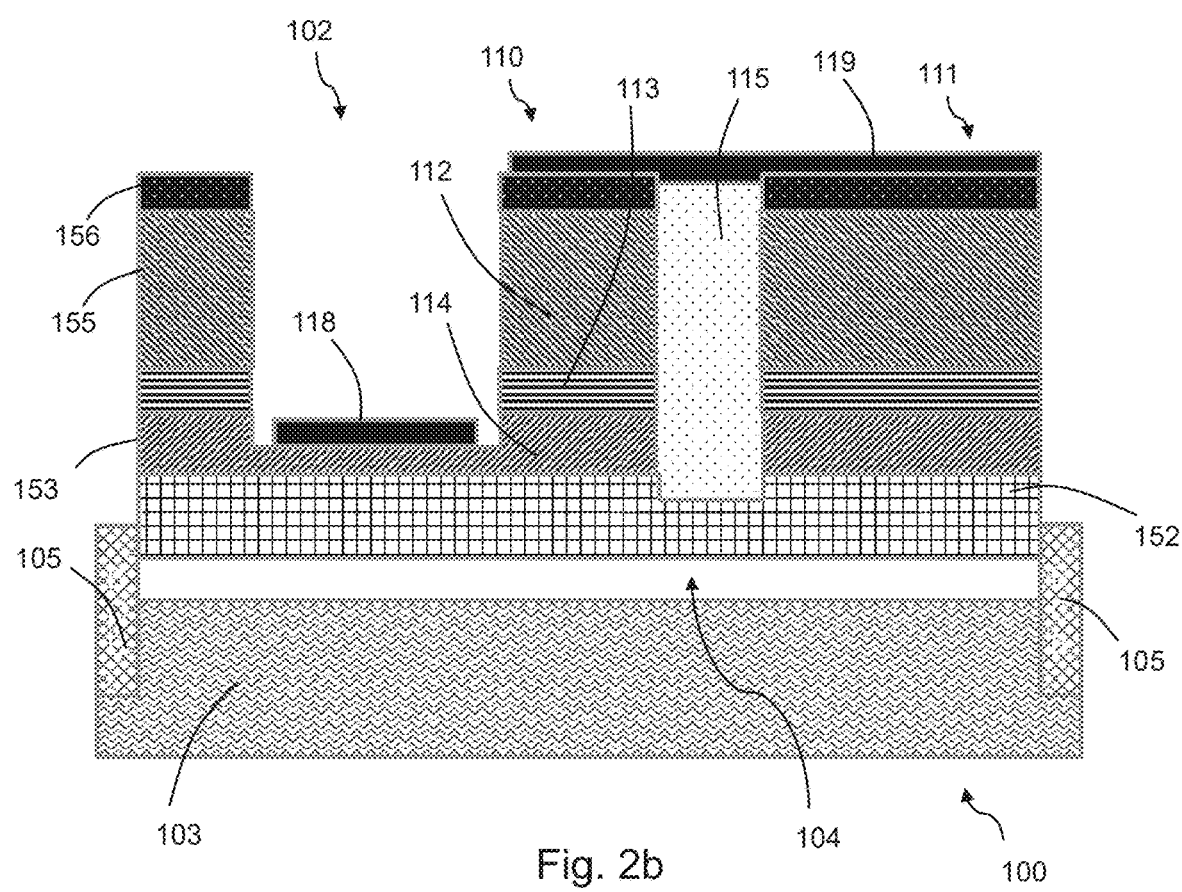

An alternative method of manufacturing a transfer die 100 according to an embodiment of the invention is illustrated in FIGS. 2a and 2b. FIG. 2b illustrates the manufactured transfer die 100.

In a first step of the method, illustrated in FIG. 2a, a III-V semiconductor stack 150 is provided.

The semiconductor stack 150 comprises a sacrificial layer 151 on top of a native substrate 103, an iron-doped layer 152 on top of the sacrificial layer 151, an n-doped layer 153 on top of the iron-doped layer 152, an optically active (multiple quantum well) layer 154 on top of the n-doped layer 153, a p-doped layer 155 on top of the optically active layer 154, and a p+ doped layer 156 on top of the p-doped layer 155.

The native substrate 103 may be an indium phosphide (InP) substrate, the sacrificial layer 151 may be an indium gallium arsenide (InGaAs) sacrificial layer, the iron-doped layer 152 may be an InP layer, the n-doped layer 153 may be an n-doped indium phosphide (N—InP) layer, the optically active layer 154 may be an aluminium indium gallium arsenide (AlInGaAs) multiple quantum well layer, the p-doped layer 155 may be a p-doped indium phosphide (P—InP) layer, and the p+ doped layer 156 may be a p-doped indium gallium arsenide (P—InGaAs) layer, for example.

An isolation trench 115 (shown in FIG. 2b) is etched, using standard patterning and etching techniques, to the iron-doped layer 152. Specifically, the isolation trench 115 is etched such that the isolation trench 115 terminates in the iron-doped layer 152, and does not extend to the sacrificial layer 151.

The isolation trench 115 laterally separates and isolates a waveguide region 110 from a bond pad 111 (as shown in FIG. 2b). The waveguide region 110 is a region of the optoelectronic device 102 in which an optical mode propagates, and is formed by a p-doped region 112 (of the p-doped layer 155), the optically active layer 154, and an n-doped region 114 (of the n-doped layer 153).

The isolation trench 115 extends vertically from a top-surface of the optoelectronic device 2 to the iron-doped layer 152 such that the isolation trench 115 and the non-conductive iron-doped layer 152 together separate and thus isolate the bond pad 111 from the waveguide region 110.

Next, a BCB fill is provided in the isolation trench 115, which retains the separation and thus isolation of the bond pad 111 from waveguide region 110, but mechanically strengthens the optoelectronic device 102.

The sacrificial layer 151 is etched away from underneath the iron-doped layer 152 to vertically space the optoelectronic device 102 from the native substrate 103. Standard etching techniques (e.g. a wet etch using HF) are used to etch away the sacrificial layer 151, leaving an undercut region 104, and tethers 105 mechanically connecting the optoelectronic device 102 and the substrate 103.

Also, a portion of the semiconductor stack 150 is etched (using standard patterning and etching techniques) to the n-doped layer 153, and an n-contact 118 is electrically connected to the n-doped layer 153. A p-contact 119 is electrically connected to the p+ doped layer 156 in the waveguide region 110 and the bond pad 111.

In the manufactured transfer die 100 (see e.g. FIG. 2b), the optoelectronic device 102 is spaced from the native substrate 103 by the undercut region 104, but is mechanically connected to the substrate 103 by the tethers 105.

The isolation trench 115 and the iron-doped region 152 together separate and thus isolate the waveguide region 110 and the bond pad 111.

Figure 3:
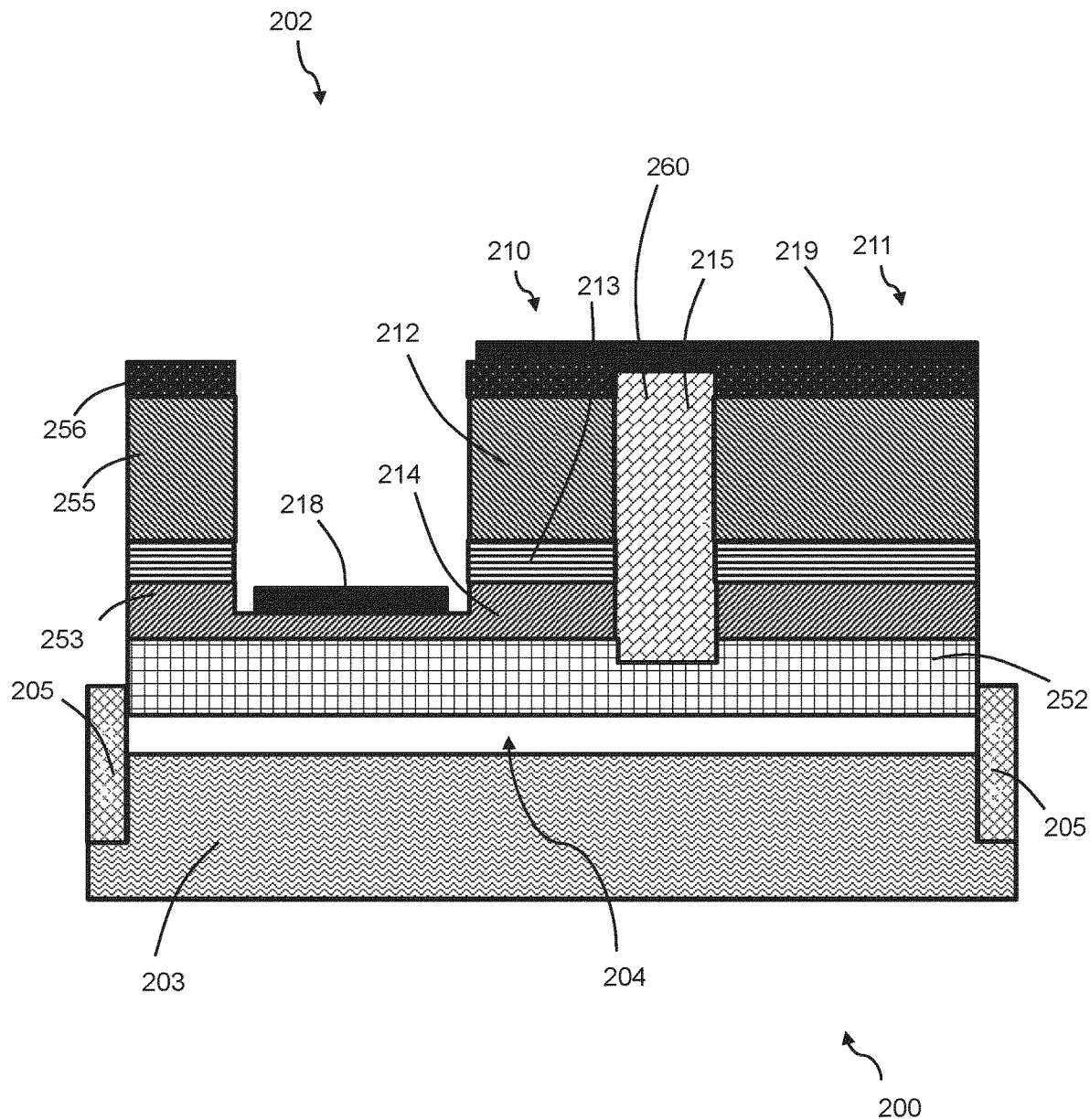
FIG. 3 illustrates a schematic cross-section of a transfer die according to another embodiment of the invention.

FIG. 3 illustrates a variant transfer die 200 according to an embodiment of the invention. Transfer die 200 comprises similar features to transfer die 100 shown in FIG. 2b, with like features having corresponding reference numerals (e.g. iron-doped layer 252 corresponds to iron-doped layer 152).

Specifically, transfer die 200 is similar to transfer die 100 except that rather than providing a BCB fill in isolation trench 215, an iron-doped material is epitaxially grown from the iron-doped layer 252 in the isolation trench 215, such that the isolation trench 215 contains an iron-doped material fill 260. The iron-doped material fill 260 mechanically strengthens the optoelectronic device 202, whilst retaining the isolation of the bond pad 211 from the waveguide region 210.

Figure 4:
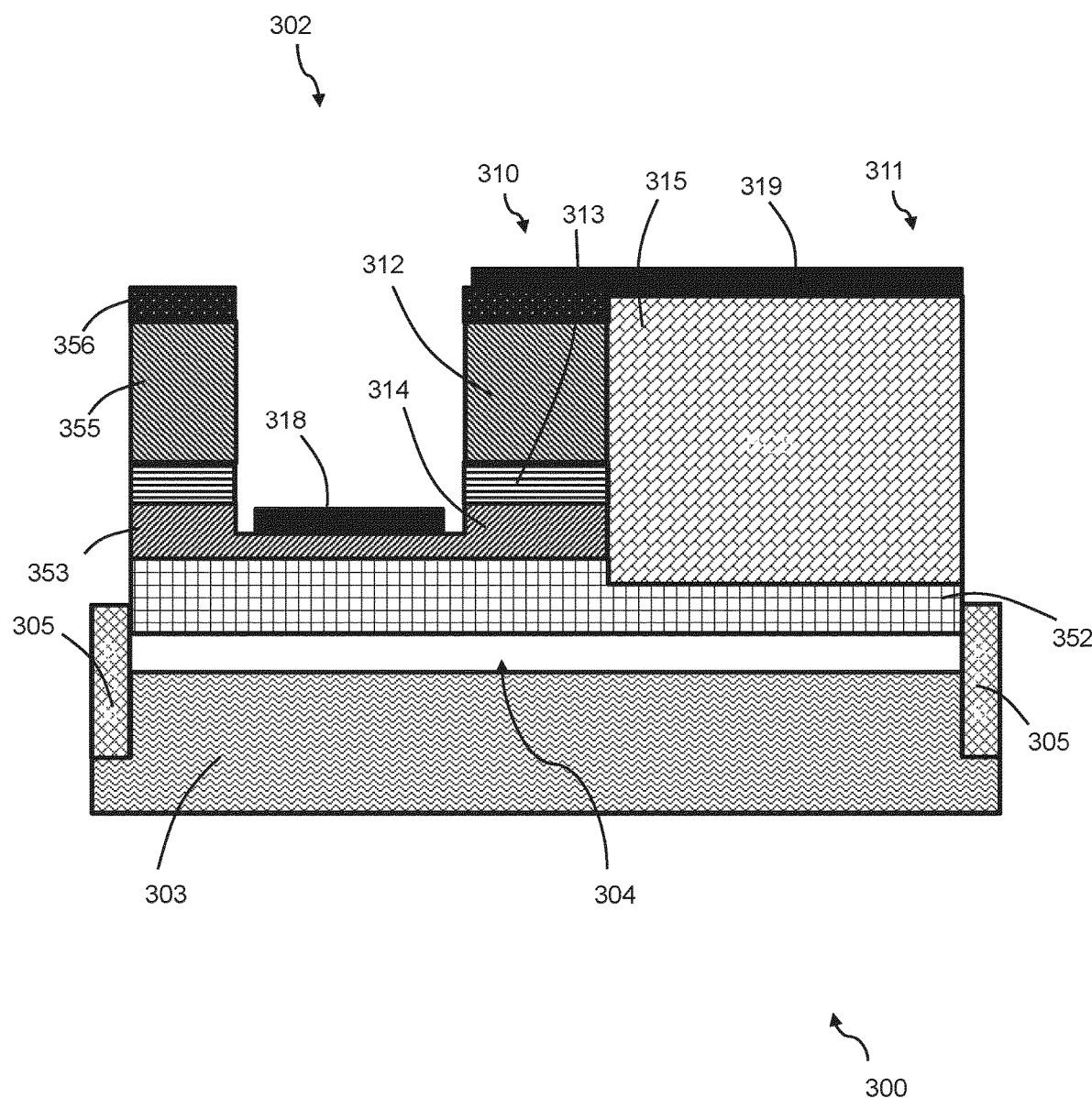
FIG. 4 illustrates a schematic cross-section of a transfer die according to another embodiment of the invention.

FIG. 4 illustrates a further variant transfer die 300. Transfer die 300 comprises similar features to transfer die 200 shown in FIG. 3, with like features having corresponding reference numerals (e.g. iron-doped layer 352 corresponds to iron-doped layer 252).

Transfer die 300 is similar to transfer die 200 except that the bond pad is an iron-doped bond pad 311 comprising an iron-doped material. In a method of manufacturing transfer die 300, a portion of the semiconductor stack on the lateral side of the isolation trench 215 opposite to the waveguide region 310 is removed, and iron-doped material is epitaxially grown from the iron-doped layer 352 to form an iron-doped bond pad 311. The iron-doped bond pad 311 is isolated from the waveguide region 310 because the iron-doped bond pad 311 is non-conductive.

The transfer die 300 may include a substrate 303, tethers 305, the iron-doped layer 352, an n-doped layer 353 including an n-doped region 314, an optically active layer 313, a p-doped layer 355 including a p-doped region 312, a p+ doped layer 356, an n-contact 318, a p-contact 319, and an isolation trench 315.

Figure 5A:
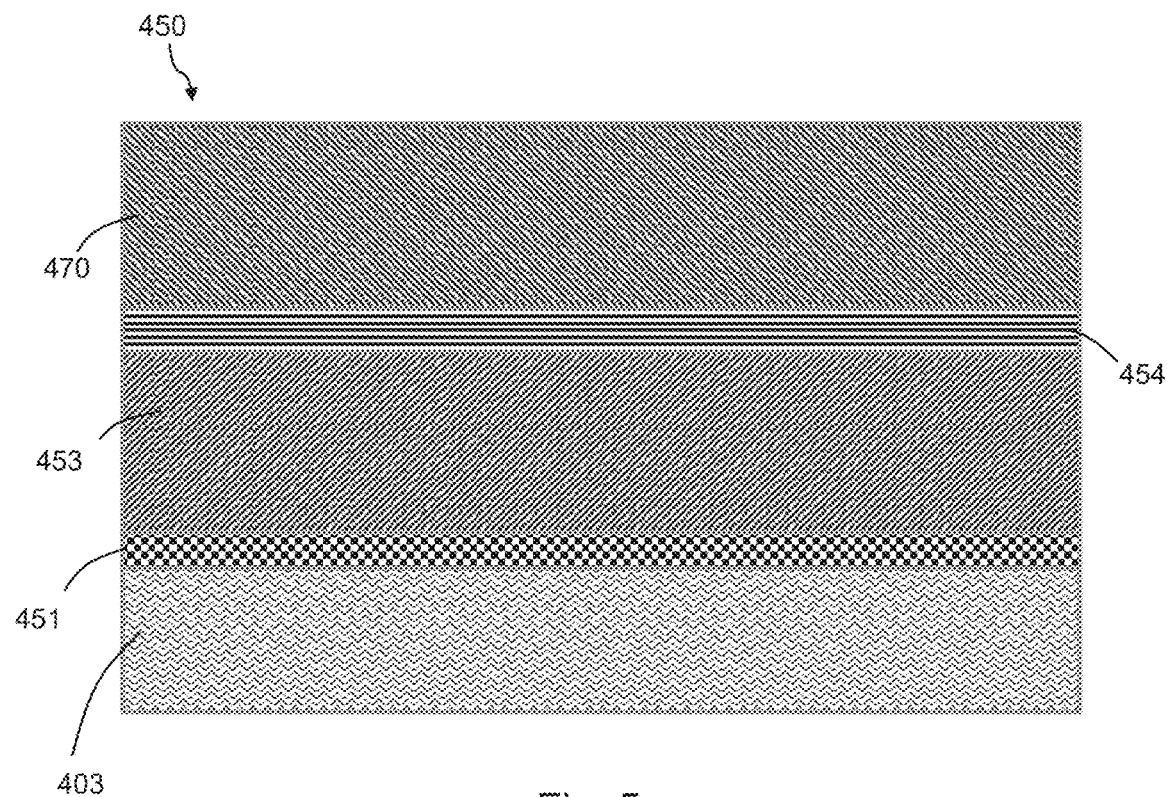
FIGS. 5a-5c illustrate a method of manufacturing a transfer die according to another embodiment of the invention.
Figure 5B:
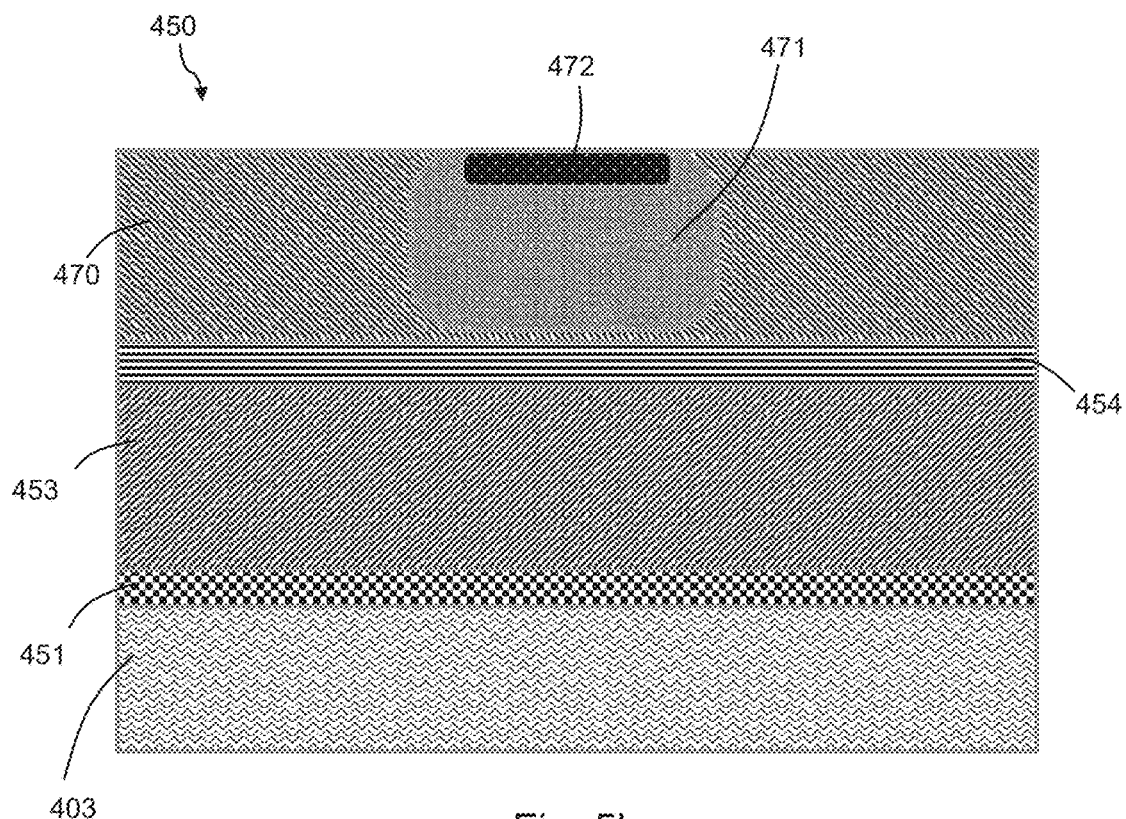
Figure 5C:
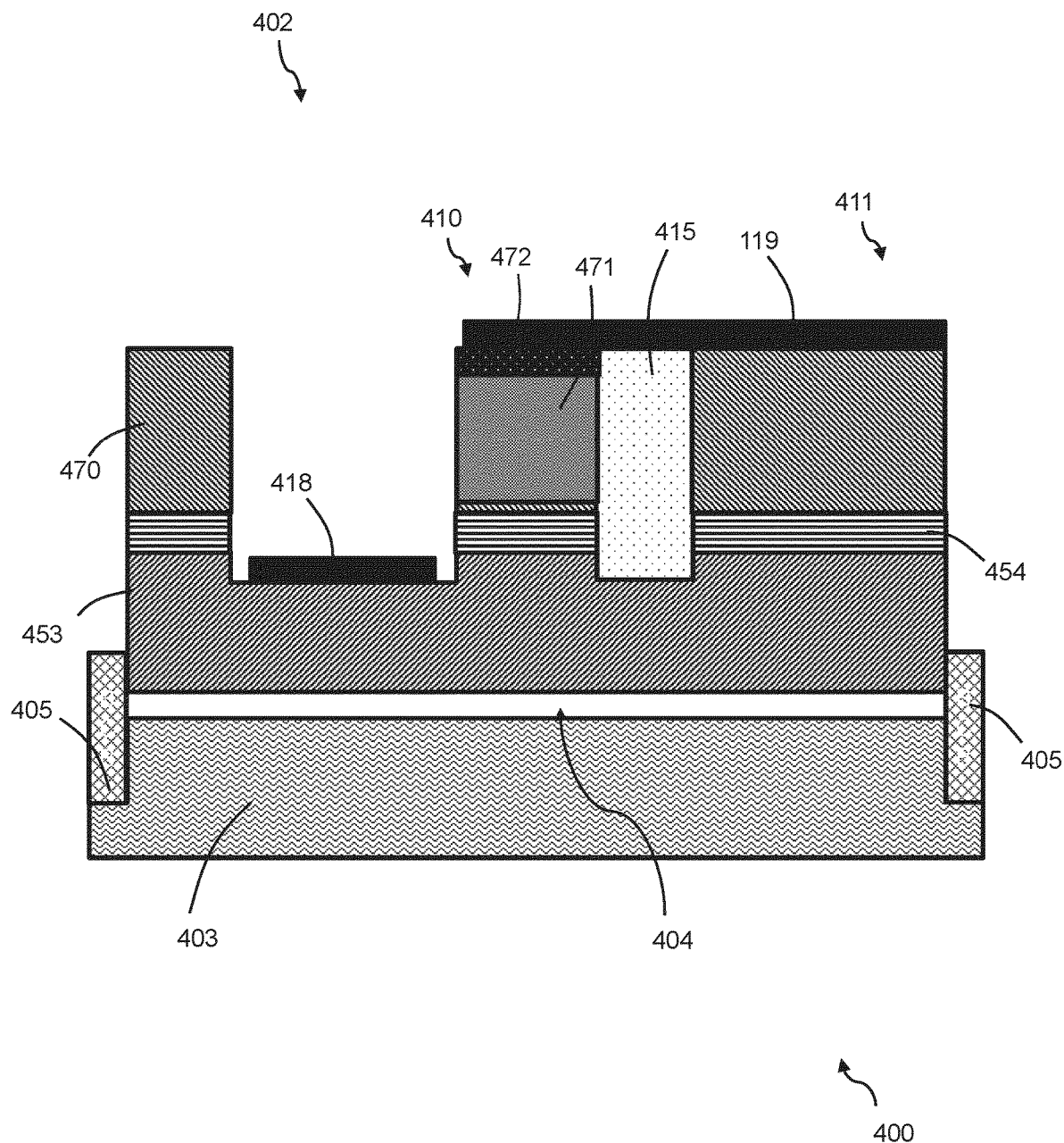

FIGS. 5a-5c illustrate an alternative method of manufacturing a transfer die 400 according to another embodiment of the invention. The manufactured transfer die 400 is shown in FIG. 5c.

In a first step of the method, illustrated in FIG. 5a, a III-V semiconductor stack 450 is provided atop substrate 403.

The semiconductor stack 450 comprises a sacrificial layer 451 on top of the native substrate 403, an n-doped layer 453 on top of the sacrificial layer 451, an optically active (multiple quantum well) layer 454 on top of the n-doped layer 453, and an un-doped layer 470 on top of the optically active layer 454.

The native substrate 403 may be an indium phosphide (InP) substrate, the sacrificial layer 451 may be an indium gallium arsenide (InGaAs) sacrificial layer, the n-doped layer 453 may be an n-doped indium phosphide (N—InP) layer, the optically active layer 454 may be an aluminium indium gallium arsenide (AlInGaAs) multiple quantum well layer, and the un-doped layer 470 may be an un-doped indium phosphide (InP) layer, for example.

Next, as shown in FIG. 5b, a p-doped region 471 is created in a portion of the un-doped layer 470 by localised diffusion of a p-dopant or by implantation using ions that result in p-doping, for example zinc. The p-doped region 471 extends downwards into the semiconductor stack 450 towards the optically active layer 454.

A p+ doped region 472 is then created in the p-doped region 471 by further localised diffusion of a p-dopant.

Next, as illustrated in FIG. 5c, an isolation trench 415 is etched into the semiconductor stack 450 from an upper surface thereof to the n-doped layer 453. The isolation trench 415 laterally separates and thus isolates a waveguide region 410 comprising the p-doped region 471 and the p+ doped region 472 from an un-doped bond pad 411. Standard patterning and etching techniques are used.

Next, a BCB fill is provided in the isolation trench 415, which retains the isolation of the un-doped bond pad 411 from waveguide region 410, but mechanically strengthens the optoelectronic device 402.

The sacrificial layer 451 is etched away from underneath the n-doped layer 453 to vertically space the optoelectronic device 402 from the native substrate 403. Standard etching techniques are used to etch away the sacrificial layer 451, leaving an undercut region 404, and tethers 405 mechanically connecting the optoelectronic device 402 and the substrate 403.

Also, a portion of the semiconductor stack 450 is etched (using standard patterning and etching techniques) to the n-doped layer 453, and an n-contact 418 is electrically connected to the n-doped layer 453. A p-contact 419 is electrically connected to the p+ doped layer 472 in the waveguide region 410 and the un-doped bond pad 411.

In the manufactured transfer die 400 (see e.g. FIG. 5c), the optoelectronic device 502 is spaced from the native substrate 403 by the undercut region 404, but is mechanically connected to the substrate 403 by the tethers 405.

The p-doped region 471 and the p+ doped region 472 are confined to the waveguide region 410.

As the bond pad 411 is un-doped, and laterally separated from the waveguide region 410 by the isolation trench 415, parasitic capacitance in the un-doped bond pad 411 is reduced.

Figure 6:
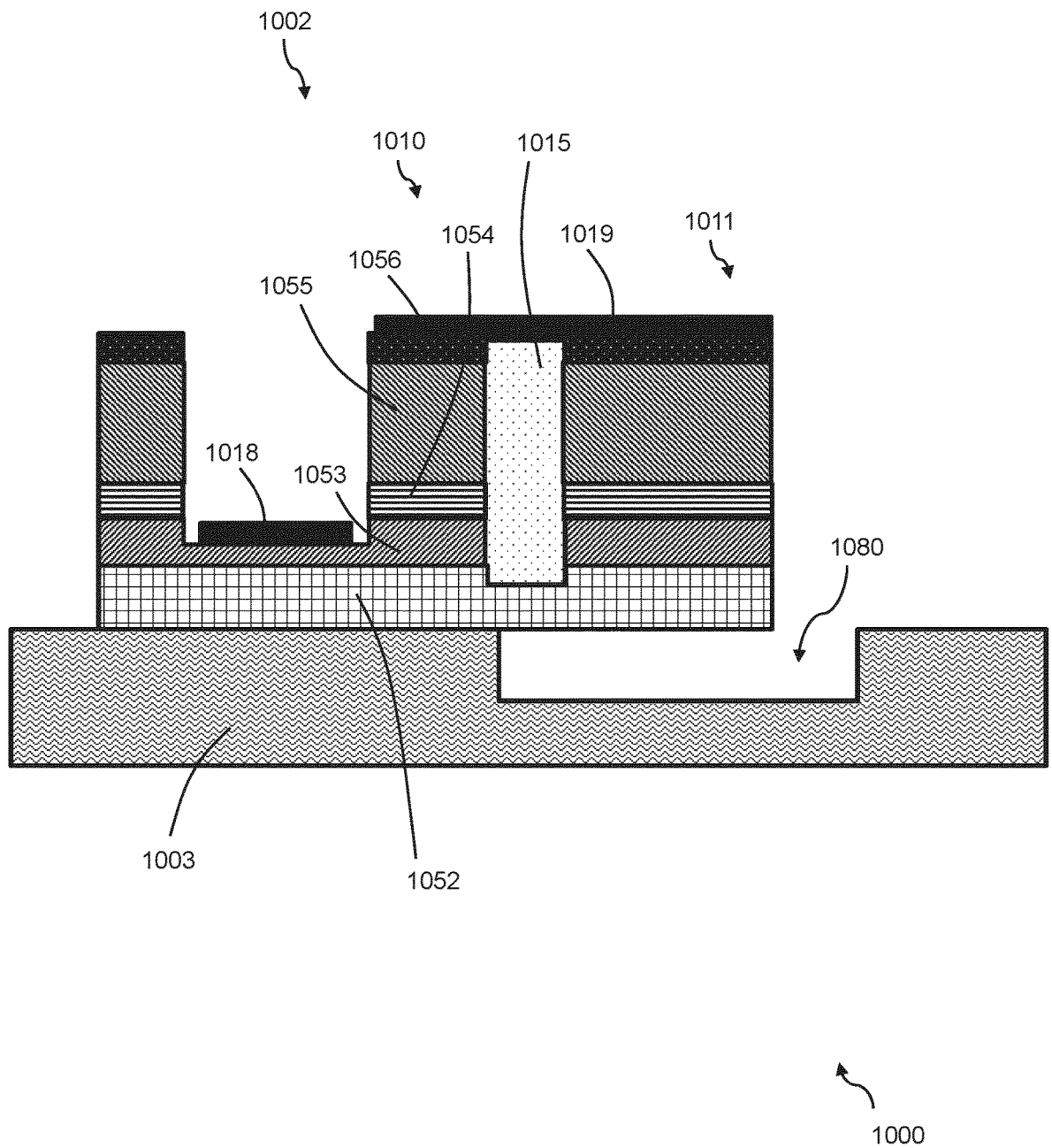
FIG. 6 illustrates a hybrid III-V/Si optoelectronic device according to an embodiment of the invention.

FIG. 6 shows a hybrid III-V/Si optoelectronic device 1000 according to an embodiment of the invention. The hybrid III-V/Si optoelectronic device comprises a III-V optoelectronic device 1002 bonded to a silicon-based platform 1003. The hybrid III-V/Si optoelectronic device is formed by a MTP process. In the MTP process, the III-V optoelectronic device of a transfer die (such as transfer die 1, 100, 200, 300, 400 shown in FIGS. 1-5 respectively), is transferred using an elastomer stamp from a native substrate to the silicon-based platform 1003 to form hybrid III-V/Si optoelectronic device 1000.

Optoelectronic device 1002 may be similar to any of optoelectronic devices 2, 102, 202, 302, 402 described above. In the example shown in FIG. 6, optoelectronic device 1002 is similar to optoelectronic device 102 shown in FIG. 2b. Alike reference numerals are provided for similar features.

Specifically, optoelectronic device 1002 comprises an iron-doped layer 1052, an n-doped region 1053 on top of the iron-doped layer 1052, an optically active (multiple quantum well) layer 1054 on top of the n-doped region 1053, a p-doped region 1055 on top of the optically active layer 1054, and a p+ doped region 1056 on top of the p-doped region 1055.

An isolation trench 1015 extends from an upper surface of p-doped region 1055 into the iron-doped layer 1052. The isolation trench 1015 laterally separates a waveguide region 1010 from a bond pad 1011. The waveguide region 1010 comprises the p-doped region 1055, the optically active layer 1054 and the n-doped region 1053. The isolation trench 1015 and the iron-doped layer 1052 together separate and thus isolate the bond pad 1011 from the waveguide region 1010.

A metal n-contact 1018 is electrically connected to the n-doped region 1053 and a metal p-contact 1019 is electrically connected to the p+ doped region 1056 and the bond pad 1011.

As shown in FIG. 6, a trench 1080 is formed in the silicon-based platform 1003 beneath the bond pad 1011. The trench 1080 may be etched using standard patterning and etching techniques before the optoelectronic device 1002 is positioned on and bonded to the platform 1003. The trench 1080 increases the distance between the bond pad 1011 and the silicon-based platform 1003, such that parasitic coupling between the silicon-based platform 1003 and the bond pad 1011 is reduced.

Figure 7:
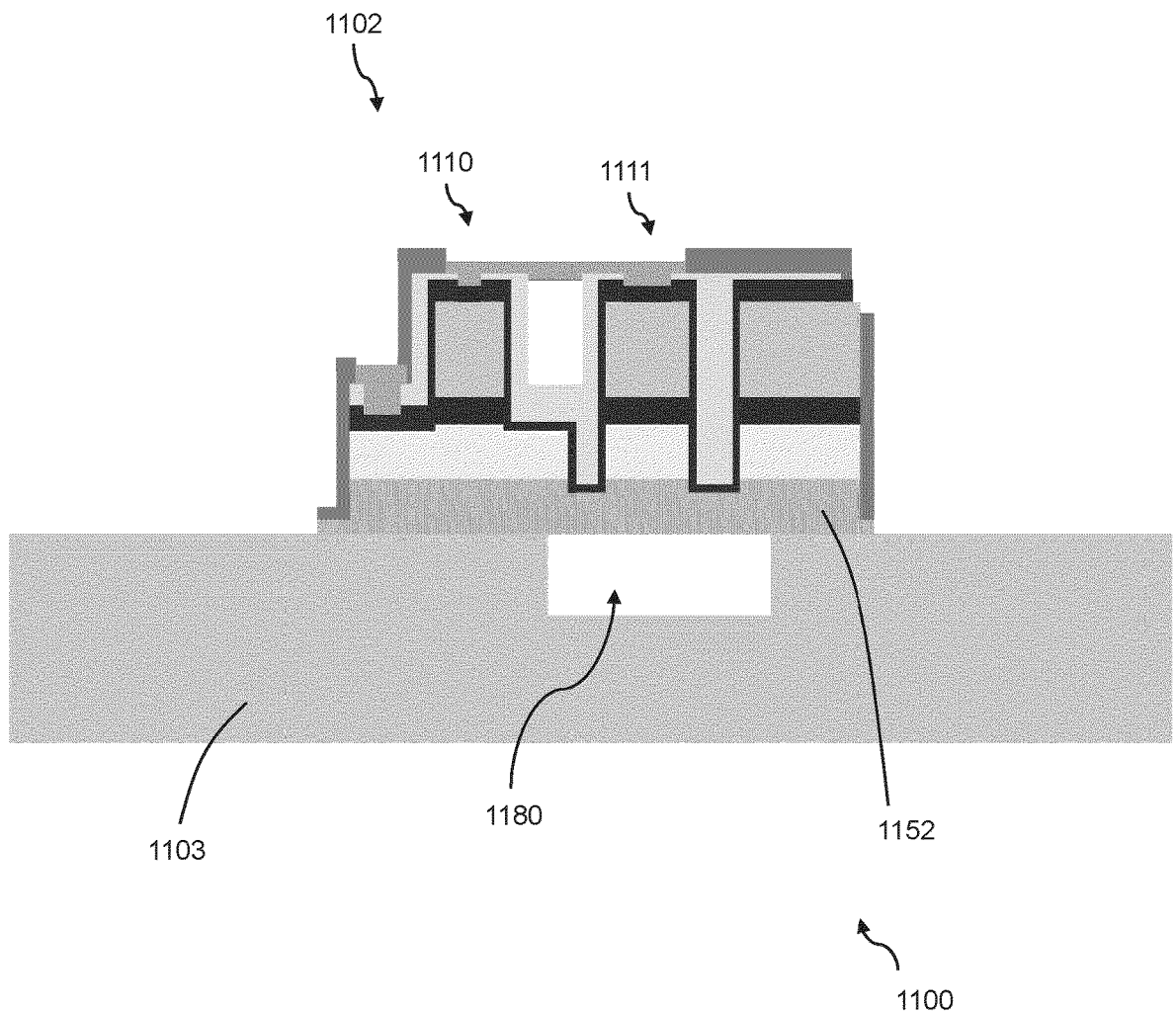
FIG. 7 illustrates a hybrid III-V/Si optoelectronic device according to an embodiment of the invention.

Another view of a manufactured hybrid III-V/Si optoelectronic device 1100 according to an embodiment of the invention is shown in FIG. 7. Similarly to hybrid III-V/Si optoelectronic device 1000, hybrid III-V/Si optoelectronic device 1100 comprises a III-V optoelectronic device 1102 bonded to a silicon-based platform 1103. The III-V/Si optoelectronic device 1102 comprises a waveguide region 1100 in which an optical mode propagates, and a bond pad 1111.

A trench 1180 is formed in the silicon-based platform 1003 beneath the bond pad 1111 in order to increase the distance between the bond pad 1111 and the silicon-based platform 1003, to thereby reduce the capacitance of the bond pad 1111.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

The invention claimed is:

1. A method of manufacturing a transfer die, the transfer die comprising an optoelectronic device suitable for bonding to a silicon-based platform via a transfer print process, the method comprising the steps of:
    providing a non-conductive isolation layer in a semiconductor stack, the semiconductor stack comprising:
        a sacrificial layer above a substrate,
        the non-conductive isolation layer directly above the sacrificial layer,
        a first doped layer, doped with a first dopant species, above the non-conductive isolation layer, and
        a second doped layer, doped with a second dopant species different from the first dopant species;
    etching an isolation trench into the semiconductor stack from an upper surface thereof only to the non-conductive isolation layer, wherein the isolation trench and the non-conductive isolation layer together separate, and electrically isolate, a bond pad from a waveguide region in the optoelectronic device;
    etching a contact trench into the semiconductor stack to the first doped layer;
    forming a first electrical contact on the first doped layer in the contact trench; and
    forming a second electrical contact on the second doped layer, the second electrical contact extending over the isolation trench from a first portion of the second doped layer in the bond pad to a second portion of the second doped layer in the waveguide region.

2. The method of claim 1, wherein the non-conductive isolation layer is an iron-doped layer in the semiconductor stack.

3. The method of claim 1, wherein the non-conductive isolation layer is created in the semiconductor stack by implantation.

4. The method of claim 3, wherein the implanted non-conductive isolation layer extends from a bottom of the etched isolation trench to the sacrificial layer.

5. The method of claim 1, further comprising the step of:
    providing a Benzocyclobutene, BCB, fill in the isolation trench.

6. The method of claim 1, further comprising the step of:
    epitaxially growing an iron-doped material in the isolation trench from the non-conductive isolation layer.

7. The method of claim 1, further comprising the step of:
    epitaxially growing an iron-doped material from the non-conductive isolation layer to form the bond pad.

8. The method of claim 1, wherein the semiconductor stack comprises an optically active layer between the first doped layer and the second doped layer.

9. The method of claim 1, further comprising the step of:
    etching away the sacrificial layer to form an undercut region which spaces the optoelectronic device from the substrate.

10. A transfer die, comprising an optoelectronic device and a substrate, the optoelectronic device being suitable for bonding to a silicon-based platform via a transfer print process,
    wherein the optoelectronic device comprises:
        a semiconductor stack, comprising:
            a non-conductive isolation layer above the substrate,
            a first doped layer, doped with a first dopant species, above the non-conductive isolation layer, and
            a second doped layer, doped with a second dopant species different from the first dopant species;
        a waveguide region in a first portion of the semiconductor stack and for guiding light through the optoelectronic device;
        a bond pad in a second portion of the semiconductor stack and for providing an electrical connection to the optoelectronic device;
        an isolation trench in the semiconductor stack and extending from an upper surface thereof only to the non-conductive isolation layer, wherein the isolation trench and the non-conductive isolation layer together separate, and electrically isolate, the bond pad from the waveguide region;
        a contact trench in the semiconductor stack and extending from the upper surface thereof to the first doped layer;
        a first electrical contact on the first doped layer in the contact trench; and
        a second electrical contact on the second doped layer, the second electrical contact extending over the isolation trench from a first portion of the second doped layer in the bond pad to a second portion of the second doped layer in the waveguide region.

11. The transfer die of claim 10, wherein the non-conductive isolation layer is an iron-doped isolation layer.

12. The transfer die of claim 10, wherein the isolation trench contains an iron-doped material.

13. The transfer die of claim 10, wherein the bond pad comprises an iron-doped material.

14. The transfer die of claim 10, wherein the non-conductive isolation layer is an ion-implantation isolation region.

15. The transfer die of claim 10, wherein the semiconductor stack further comprises a sacrificial layer above the substrate, and the non-conductive isolation layer is directly above the sacrificial layer.

* * * * *